United States Patent
Andersen et al.

(10) Patent No.: US 6,307,805 B1
(45) Date of Patent: Oct. 23, 2001

(54) HIGH PERFORMANCE SEMICONDUCTOR MEMORY DEVICE WITH LOW POWER CONSUMPTION

(75) Inventors: John E. Andersen, Essex Junction; Terence B. Hook, Jericho, both of VT (US); Louis L. Hsu, Fishkill; Wei Hwang, Armonk, both of NY (US); Stephen V. Kosonocky, Darien, CT (US); Li-Kong Wang, Montvale, NJ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/745,227

(22) Filed: Dec. 21, 2000

(51) Int. Cl.[7] ....................................................... G11C 7/00
(52) U.S. Cl. ...................................... 365/230.06; 365/154
(58) Field of Search .............................. 365/230.06, 154, 365/189.09

(56) References Cited

U.S. PATENT DOCUMENTS 5,726,944 * 3/1998 Pelley, III et al. .................... 365/226
6,219,270 * 4/2001 Van Geloven et al. ............. 365/149

OTHER PUBLICATIONS

Takashima et al., "Standby/Active Mode Logic for Sub–1–V Operating ULSI Memory", IEEE Journal of Solid–State Circuits, vol. 29, No. 4, Apr. 1994, pp. 441–447.

Sekiyama, et al., "A 1–V Operating 256–kb Full–CMOS SRAM", IEEE Journal of Solid–State Circuits, vol. 27, No. 5, May 1992, pp. 776–782.

Morimura, et al., "A Step–Down Boosted–Wordline Scheme for 1–V Battery–Operated Fast SRAM s", IEEE Journal of Solid–State Circuits, vol. 33, No. 8, Aug. 1998, pp. 1220–1227.

Shibata, et al., "A 1–V, 10–MHz, 3.5–mW, 1–Mb MTCMOS SRAM with Charge–Recycling Input/Output Buffers", IEEE Journal of Solid–State Circuits, vol. 34, No. 6, Jun. 1999, pp. 866–877.

* cited by examiner

*Primary Examiner*—Vu A. Le

(57) ABSTRACT

A semiconductor memory device accessed with wordlines and bitlines has memory cells which operate at high performance with lower power consumption and have a high density. Each of the memory cells has pass transistors connected to a corresponding wordline and a corresponding pair of bitlines, and the pass transistors are gated by a signal of the corresponding wordline. The semiconductor memory device includes a wordline drive unit for selectively driving the wordlines in response to a row address. A wordline driver in the wordline drive unit boosts a corresponding wordline in a positive direction when the corresponding wordline is activated to access the memory cell and boosts the corresponding wordline in a negative direction when the corresponding wordline is inactive. By boosting the wordline in the positive direction, the performance of the memory cells is enhanced, and by boosting the wordline in the negative direction, a leakage current in the pass transistors with a low-threshold voltage is prevented.

17 Claims, 4 Drawing Sheets

HIGH PERFORMANCE SEMICONDUCTOR MEMORY DEVICE WITH LOW POWER CONSUMPTION

BACKGROUND OF THE INVENTION

1. Field of the Invention

The present invention relates to a semiconductor memory device, and more particularly, to a semiconductor memory device having high density and capability of high performance at low supply voltage.

2. Description of the Related Art

In electronic systems, power consumption is one of the factors determining efficiency and functionality of the system. With the proliferation of wireless and portable electronic devices such as palm top computers, cellular telephones, etc., power consumption has become an important factor to be considered in designing and manufacturing such electronic devices. This is because the portable electronic devices are typically subject to the limitation of battery lifetime, i.e., a duration of usage of a battery between charges. Thus, in battery operated portable electronic devices, there have been efforts to reduce the power consumption of the devices which is an important factor determining the battery lifetime.

For semiconductor memories to be used in the electronic devices, complementary metal oxide silicon (CMOS) technology is most commonly used. Compared with other types of memory cells, CMOS memory cells have a considerable advantage in being much lower in the power consumption. This lower power consumption is due to the fact that either the NMOS or the PMOS transistor of a single CMOS gate in a CMOS memory cell is always off so that there is ideally no direct power drain in the standby mode of the memory cell.

In the technology of CMOS memories, a typical method of reducing the power consumption is lowering a supply voltage for the memories. By lowering the supply voltage, however, operating speed of the memories is degraded such that memory access speed slows down. Such a degradation in the operation speed may be improved by reducing the threshold voltage of the transistors in the memories. In this case, however, the reduction of the threshold voltage causes an increase in subthreshold leakage current of the transistors. The power dissipation due to the subthreshold leakage current is not negligible and affects (i.e., shortens) the battery lifetime.

To overcome these drawbacks, for example, a theory of reducing power consumption of static memories by using multi-threshold voltage CMOS (MTCMOS) technique is disclosed in "1-V, 10-MHz, 3.5-mW, 1-Mb MTCMOS SRAM with Charge-Recycling Input/Output Buffers", by Shibata et al., June 1999, IEEE Journal of Solid-State Circuits, Vol. 34, No. 6, pp. 866–877. Shibata et al. disclose a six-transistor-type CMOS memory cell which is made up of high-threshold voltage MOSFET's in order to suppress the power dissipation due to larger subthreshold leakage current. The leakage current in each logic gate of a memory cell is reduced by the high-threshold voltage transistors which are cut off during the standby mode. However, a memory cell having pass transistors with the high-threshold voltage has such problems as described below in detail.

Referring to FIG. 1, there is provided a circuit diagram illustrating a conventional SRAM cell formed using the MTCMOS technique. The SRAM cell 10 has two pass transistors T11, T12 and two CMOS inverters 12, 14 each of which has a PMOS transistor and an NMOS transistor. In the SRAM cell 10, to prevent subthreshold leakage current which occurs during the standby mode, transistors with a high-threshold voltage are used for all the six transistors including the pass transistors T11, T12. It is well known that MOS transistors with the high-threshold voltage have much less subthreshold leakage current than MOS transistors with a low-threshold voltage. Thus, the subthreshold leakage current can be substantially prevented by using the MOS transistors with the high-threshold voltage for the pass transistors T11, T12.

As a result, however, the performance of the SRAM cell 10 is significantly affected by the high-threshold voltage pass transistors T11, T12. For example, the use of the high-threshold voltage transistors T11, T12 may cause a decrease in the read/write operation of the SRAM cell. This is because a high-threshold voltage transistor takes longer time than a low-threshold voltage transistor in processing an input signal. In other words, since the operation speed of a transistor is proportional to the difference between a supply voltage and a threshold voltage of the transistor, the signal processing in a high-threshold transistor is slower than that in a low-threshold voltage transistor.

Furthermore, in order for the SRAM cell 10 to operate stably, the pass transistors T11, T12 should have weaker strength than pull-down NMOS transistors T13, T14 in the CMOS inverters 12, 14. In other words, the pull-down NMOS transistors T13, T14 should have a large size enough to maintain the stable operation of the SRAM cell 10, or the two pass transistors T11, T12 should be very small. However, small pass transistors can significantly reduce the read/write operation speed of the SRAM cell. Thus, the size of the SRAM cell 10 cannot be optimally minimized due to such a difficulty to maintain a reasonable "beta ratio" between the two pass transistors T11, T12 and the pull-down NMOS transistors T13, T14.

Therefore, a need exists for a CMOS memory cell of which access operation can be performed at high speed and with lower power consumption. Further, it is desirable that the CMOS memory cell has a minimum size so that a memory array made up of such CMOS memory cells has high density.

OBJECTS AND SUMMARY OF THE INVENTION

It is an object of the present invention to provide a semiconductor memory cell employing pass transistors having a low-threshold voltage to improve the performance such as memory access speed.

It is another object of the present invention to provide a semiconductor memory cell which can prevent leakage current in a standby mode of the memory cell and improve the performance of the memory cell by using a "dual-direction" wordline boosting technique.

It is still anther object of the present invention to provide a memory cell employing pass transistors with "high beta" to reduce the size of the memory cell, thus allowing the memory to have a higher density.

To achieve the above and other objects, the present invention provides a semiconductor memory device accessed with wordlines and bitlines, including memory cells of which a memory cell has pass transistors connected to a corresponding wordline and a corresponding pair of bitlines, where the pass transistors are gated by a signal of the corresponding wordline, and a wordline drive unit for selectively driving the wordlines in response to a row address, wherein a wordline driver in the wordline drive unit boosts the corresponding wordline in a positive direction when the corresponding wordline is activated to access the memory cell and boosts the corresponding wordline in a negative direction when the corresponding wordline is inactive.

The semiconductor memory device may also include a row decoder for decoding the row address to provide to the wordline drive unit a signal to select one of the wordlines, a virtual power supply unit connected between the row decoder and a power supply, for providing a virtual supply voltage to the row decoder, and a virtual ground unit connected between the row decoder and a ground, for providing a virtual ground to the row decoder.

In the semiconductor memory device, the pass transistors preferably have a threshold voltage lower than a threshold voltage of transistors other than the pass transistors in the memory cell. And, the wordline driver boosts the corresponding wordline in the negative direction to the extent of substantially preventing a leakage current in the pass transistors.

The wordline driver preferably includes a p-channel MOS (PMOS) transistor disposed in an n-well, an n-channel MOS (NMOS) transistor disposed in a p-well, and an n-band doped with negative ions and disposed under the p-well to isolate the p-well from other p-wells in the wordline driver. The n-well may be biased with a voltage higher than a supply voltage when the wordline driver boost the corresponding wordline in the positive direction. The p-well may be biased with a voltage lower than a ground when the wordline driver boosts the corresponding wordline in the negative direction.

In an aspect of the present invention, there is provided a method for controlling a leakage current in a memory cell having pass transistors with a low-threshold voltage. The method preferably includes the step of boosting a wordline connected to the memory cell in a negative direction when the wordline is inactive. The method may further include boosting the wordline in a positive direction when the wordline is activated to access the memory cell.

The step of boosting the wordline in the positive direction preferably includes applying a voltage higher than a supply voltage of the memory cell to an n-well in a wordline driver boosting the wordline, wherein the n-well is associated with a PMOS transistor connected to an output of the wordline driver. The step of boosting the wordline in the negative direction preferably includes the steps of forming an n-band doped with negative ions under a p-well in a wordline driver boosting the wordline, wherein an NMOS transistor is disposed in the p-well to connect to an input of the wordline driver, isolating the p-well from other p-wells with the n-band and n-wells in the wordline driver, and applying a voltage lower than a ground to the p-well.

These and other objects, features and advantages of the present invention will become apparent from the following detailed description of illustrative embodiments thereof, which is to be read in connection with the accompanying drawings.

BRIEF DESCRIPTION OF THE DRAWINGS

This disclosure will present in detail the following description of preferred embodiment with reference to the following figures wherein.

DESCRIPTION OF PREFERRED EMBODIMENTS

Detailed illustrative embodiments of the present invention are disclosed herein. However, specific structural and functional details disclosed herein are merely representative for purposes of describing preferred embodiments of the present invention.

The present invention provides a semiconductor memory cell having capability of operating high performance at low supply voltage, thereby having lower power dissipation. As a preferred embodiment of the semiconductor memory cell of the present invention, a complementary metal oxide silicon (CMOS) memory cell employing multi-threshold voltage CMOS (MTCMOS) technique. It should be noted that the present invention is not limited to the CMOS memory cell. The present invention may apply to any type of memory cell which employs pass transistors to improve the performance of the memory cell and/or to a method for controlling a leakage current in a semiconductor memory cell at a standby mode.

A CMOS memory cell using the MTCMOS technique (e.g., SRAM memory cell) has pass transistors having a low-threshold voltage and transistors other than the pass transistors having a high-threshold voltage. By using the low-threshold voltage pass transistors in the memory cell, the performance of the memory cell itself and a memory array made up of such memory cells can be improved. For example, the speed of read/write operation of the memory cell or the memory array can be enhanced.

Also, the use of the low-threshold voltage transistors allows the memory cell to have a smaller size so that the memory array can have a higher density. This is described in detail below.

In addition, the present invention introduces a "dual-direction" wordline boosting technique to improve the performance of the memory cell and to effectively control the leakage current in the memory cell at a standby mode. By employing the dual-direction wordline boosting technique in the CMOS memory cell of the present invention, the time delay in accessing the memory cell can be substantially prevented so that the performance of the memory cell can be further improved. Also, a wordline associated with the memory cell can be boosted in the negative direction as well as the positive direction so that the leakage current from the memory cell to bit-lines can be prevented, thereby improving the power consumption. This also will be described in detail.

Figure 1:
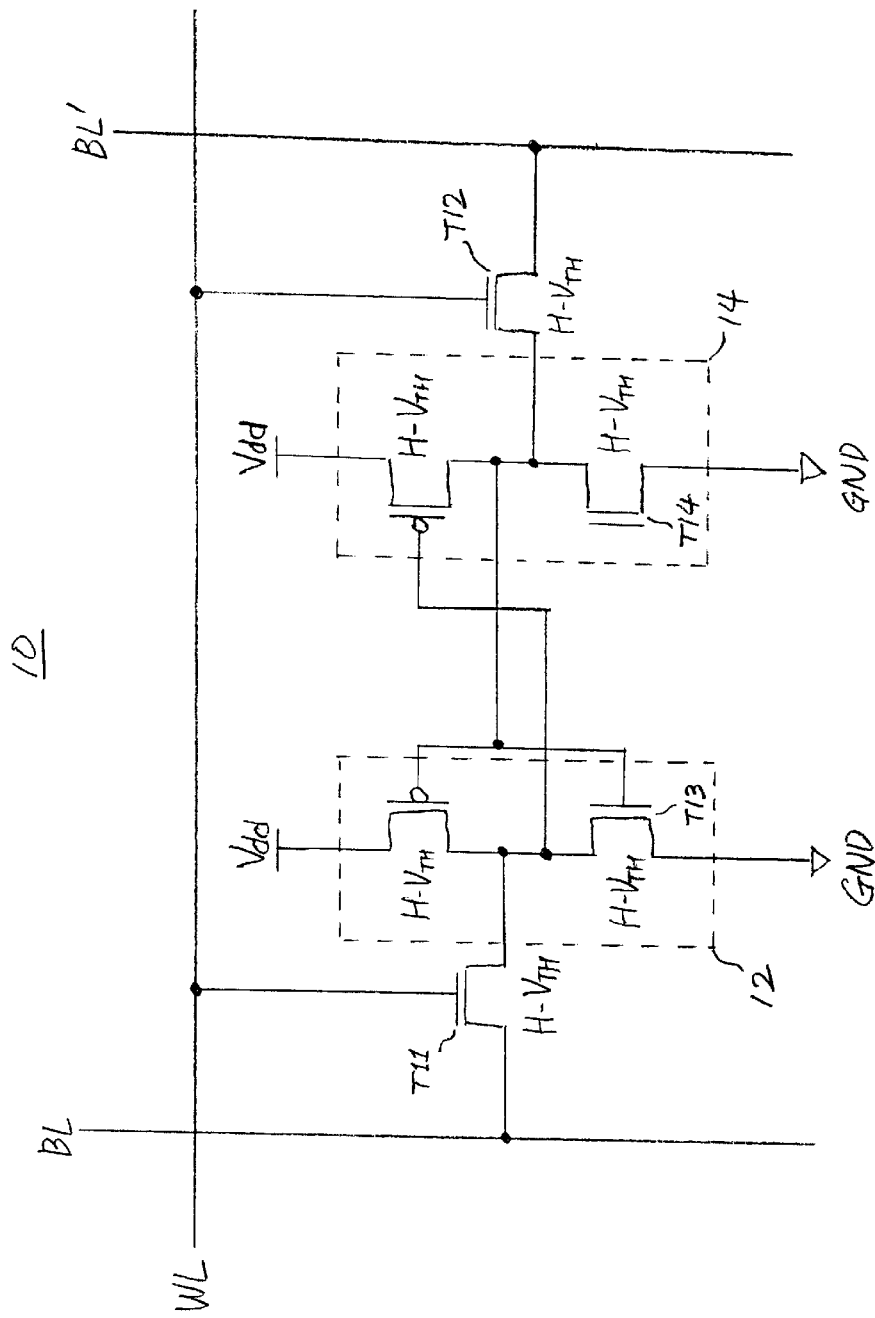
FIG. 1 is a circuit diagram depicting a typical SRAM cell.
Figure 2:
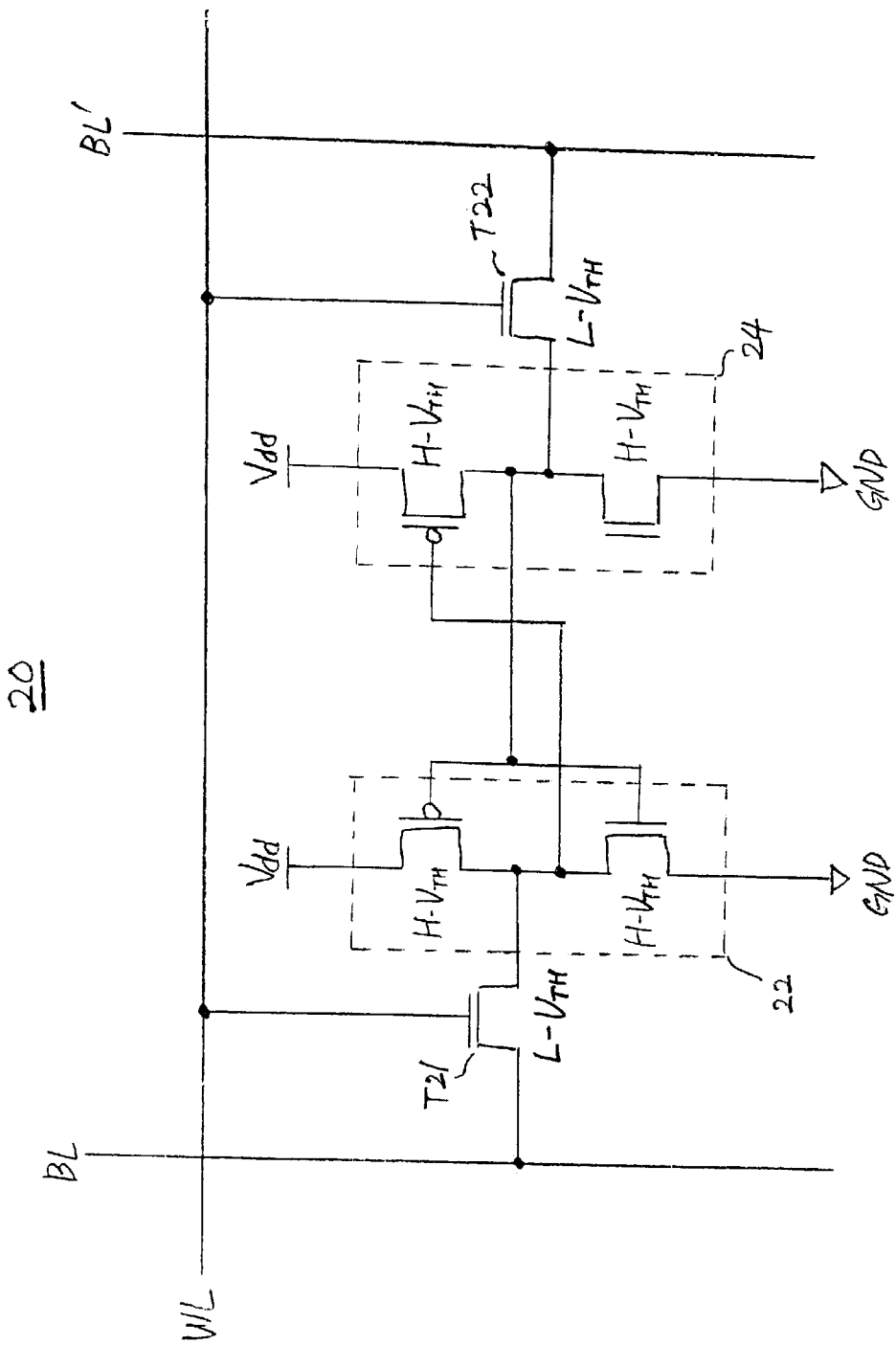
FIG. 2 is a circuit diagram depicting a SRAM cell according to a preferred embodiment of the present invention.

Referring to FIG. 2, there is provided a circuit diagram depicting a CMOS memory cell according to a preferred embodiment of the present invention. The CMOS memory cell 20 is preferably a static random access memory (SRAM) cell having two CMOS inverters 22, 24 and two pass transistors T21, T22. Each of the CMOS inverters 22, 24 has an n-channel MOS (NMOS) transistor and a p-channel MOS (PMOS) transistor connected to each other in series. Such CMOS inverters 22, 24 are basic gates in the CMOS circuit. They are used in a peripheral logic of a memory device and in input/output buffers in a full CMOS SRAM cell. The structure and operation of the CMOS inverters 22, 24 in the SRAM cell 20 are identical to those of the CMOS inverters 12, 14 in the SRAM cell 10 in FIG. 1 and well known in this art, thus a detailed description thereof is omitted.

In the SRAM cell 20, the two pass transistors 22, 24 are preferably NMOS transistors having a low-threshold voltage. For the CMOS technology, the low-threshold voltage of the pass transistors T21, T22 is, for example, about 0.3 volt for a power supply of about 1.8 volt. Compared with this, the high-threshold voltage of a conventional pass transistor is, for example, about 0.9 volt.

Generally, compared a CMOS transistor with the high-threshold voltage, a CMOS transistor with the low-threshold voltage has higher leakage current. The leakage current may be defined as a current flow in a conduction path of a transistor when the gate voltage of the transistor is equal to zero.

The leakage current in the pass transistors T21, T22 with the low-threshold voltage can be prevented by applying a negative voltage on the gate of each of the pass transistors T21, T22. To apply the negative voltage to the gates, a wordline WL connected to the memory cell 20 is boosted in the negative direction. Thus, when the negative voltage is applied to the gates of the low-threshold voltage pass transistors T21, T22, the leakage current in the pass transistors T21, T22 is substantially prevented. This technique is further described in detail below referring to FIG. 3.

In addition to the prevention of the leakage current by boosting the wordline WL in the negative direction, the performance of the memory cell 20 can be improved by boosting the wordline WL in the positive direction. The positive-direction wordline-boosting technique is effective in shortening a delay time in the memory access performance. The delay time is, for example, a time period from a wordline selection to a sense amplifier output in a read operation.

When the wordline WL is selected to access the memory cell 20, the wordline WL is boosted by a wordline driver (referring to 42 in FIG. 4) to have a voltage level of the wordline WL higher than a supply voltage. Preferably, the voltage level of the wordline WL is boosted above the supply voltage plus the threshold voltage of the pass transistors. Thus, the positively-boosted voltage is applied to the gates of the pass transistors T21, T22 when the wordline WL is selected, so that the delay time in accessing the memory cell 20 is substantially shortened.

On the other hand, when the wordline WL is not selected (i.e., the memory cell 20 is not accessed), the wordline WL is boosted in the negative direction and remains at the negative voltage to prevent the leakage current in the low-threshold voltage pass transistors T21, T22. Here, the wordline WL is boosted in the negative direction preferably to the extent of substantially preventing the leakage current in the pass transistors T21, T22 at the standby mode of the memory cell 20.

By employing the pass transistors T21, T22 with the low-threshold voltage in the SRAM cell 20, the performance such as memory access speed can be improved. In order to perform the read/write operation with respect to the memory cell 20, complementary data (i.e., data opposite in polarity) should be transferred from/to the CMOS inverters 22, 24 through the bitlines BL, BL'. The more powerful the pass transistors T21, T22 are, the faster the data transfer is performed.

In a conventional memory cell, for a consideration of the low power consumption, a lower supply voltage and low-threshold voltage transistors are employed. As a result, when the memory cell is in a standby mode (i.e., not accessed), the data stored in the memory cell leaks away from the memory cell to bitlines due to the high leakage current in the low-threshold voltage pass transistors in the memory cell. To solve such problems, the high-threshold voltage pass transistors are employed in the conventional memory cell, as shown in FIG. 1. As mentioned above, however, the conventional memory cell has the performance drawback such as the time delay in accessing the memory cell due to the high-threshold voltage of the pass transistors.

In the present invention, the performance of the memory cell is improved by employing the pass transistors T21, T22 having the low-threshold voltage. In other words, by using the low-threshold voltage pass transistors T21, T22, the delay time is substantially shortened so that memory access speed is improved. Also, the leakage current problem in the memory cell due to the use of the low-threshold voltage pass transistors is prevented in the present invention by employing the "dual-direction" wordline boosting technique, in particular, the negative-direction wordline boosting technique.

Furthermore, the CMOS memory cell of the present invention can have a smaller size than that of the conventional memory cell. The memory cell 20 in FIG. 2 preferably employs NMOS transistors as the pass transistors T21, T22. It is well known in this art that the size of an NMOS transistor with the low-threshold voltage is smaller than that of an NMOS transistor with the high-threshold voltage. Thus, the memory cell 20 having the NMOS transistors T21, T22 with the low-threshold voltage can have a smaller size than a conventional memory cell (e.g., memory cell 10 in FIG. 1) having the NMOS transistors with the high-threshold voltage. Therefore, a memory device made up of the memory cells of the present invention can have a higher density.

Figure 3:
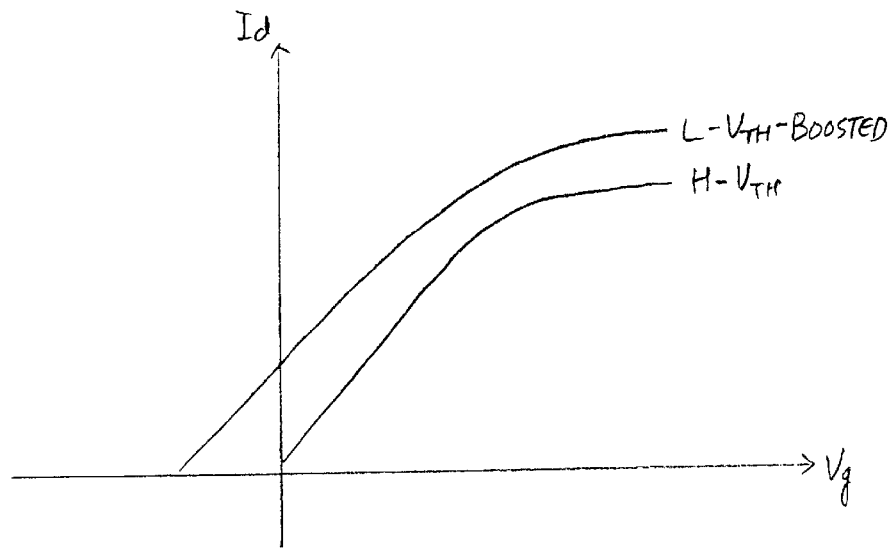
FIG. 3 shows a comparison between characteristic output curves of the pass transistors in FIGS. 1 and 2.

FIG. 3 shows a characteristic output curve of the pass transistors in the memory cell in FIG. 2 in comparison with that of the pass transistors used in the conventional memory cell. Assuming that the pass transistors are NMOS transistors, the curves in FIG. 3 show the relationship of the drain current ($I_d$) and the gate voltage ($V_g$) of the pass transistors. The x-axis representing the gate voltage ($V_g$) is in linear scale, while the y-axis representing the drain current ($I_d$) is in log scale.

The first curve (H–$V_{TH}$) represents the $I_d$–$V_g$ characteristic of the pass transistors with the high-threshold voltage used in the conventional memory cell. The first curve indicates that when the gate voltage ($V_g$) is zero, the pass transistors with the high-threshold voltage have very small leakage current.

In contrast, the second curve (H–$V_{TH}$-Boosted) represents the $I_d$–$V_g$ characteristic of the pass transistors with the low-threshold voltage used in the memory cell of the present invention, where a boosted voltage is applied to the pass transistors through a corresponding wordline. The second curve indicates that when the gate voltage ($V_g$) is zero, the pass transistors with the low-threshold voltage has relatively large leakage current, and that the leakage current becomes very small when the gate voltage ($V_g$) has an enough negative value. In other words, the leakage current in the low-threshold voltage pass transistors becomes substantially equal to or less than that in the high-threshold voltage pass transistors by applying the negative voltage to the gates of the pass transistors with the low-threshold voltage. The negative voltage is applied to the gates of the pass transistors by boosting in the negative direction the wordline associated with the memory cell.

The second curve (H–$V_{TH}$-Boosted) also indicates that when a high positive value of the gate voltage ($V_g$) is applied to the low-threshold voltage pass transistors, the current in the low-threshold voltage pass transistors is much higher than that in the high-threshold voltage pass transistors. This can be accomplished by boosting the wordline associated with the memory cell in the positive direction.

Figure 4:
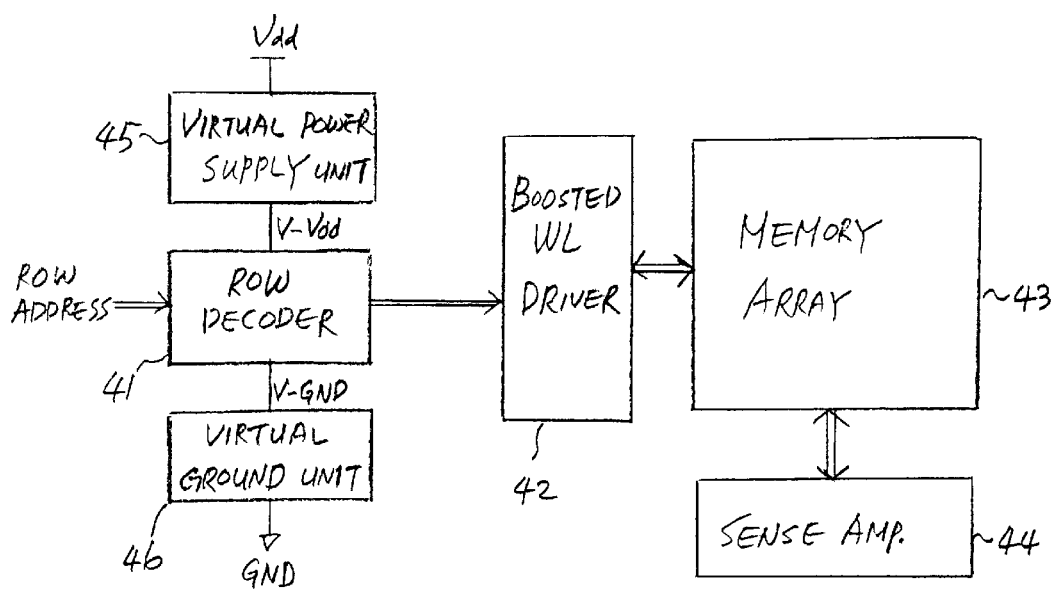
FIG. 4 is a block diagram depicting a memory array and accessing devices thereof according to the present invention.

Referring to FIG. 4, there is provided a block diagram depicting a memory array and memory accessing devices thereof according to a preferred embodiment of the present invention. A row decoder 41 receives and decodes a row address to generate a wordline select signal to select a corresponding bit in the memory array 43. By receiving the wordline select signal from the row decoder 41, wordline drivers 42 turn on a wordline corresponding to the selected bit in the memory array 43. Then, sense amplifiers 44 sense data in a memory cell accessed by the activated wordline as well as a bitline.

In the present invention, there are provided a virtual power supply unit 45 and a virtual ground unit 46 to provide to the row decoder 41 a virtual supply voltage (V-$V_{dd}$) and a virtual ground (V-GND), respectively. The virtual power supply unit 45 is connected between the row decoder 41 and the power supply ($V_{dd}$), and the virtual ground (V-GND) is connected between the decoder 41 and the ground (GND). In other words, the row decoder 41 is not connected directly to the power supply ($V_{dd}$) and the ground (GND). Instead it is connected to the power supply ($V_{dd}$) and the ground (GND) through the virtual power supply unit 45 and the virtual ground unit 46, respectively. Such a cascade connection of the elements can significantly reduce the power consumption in a standby mode. This is because the direct current from the power supply ($V_{dd}$) to the ground (GND) can be significantly reduced by the cascade connection of the virtual power supply unit 45 and the virtual ground unit 46. Preferably, the virtual power supply unit 45 may be implemented by a PMOS transistor of which conduction path is connected between the power supply ($V_{dd}$) and the row decoder 41. The virtual ground unit 46 may be implemented by an NMOS transistor of which conduction path is connected between the ground (GND) and the row decoder 41.

Figure 5:
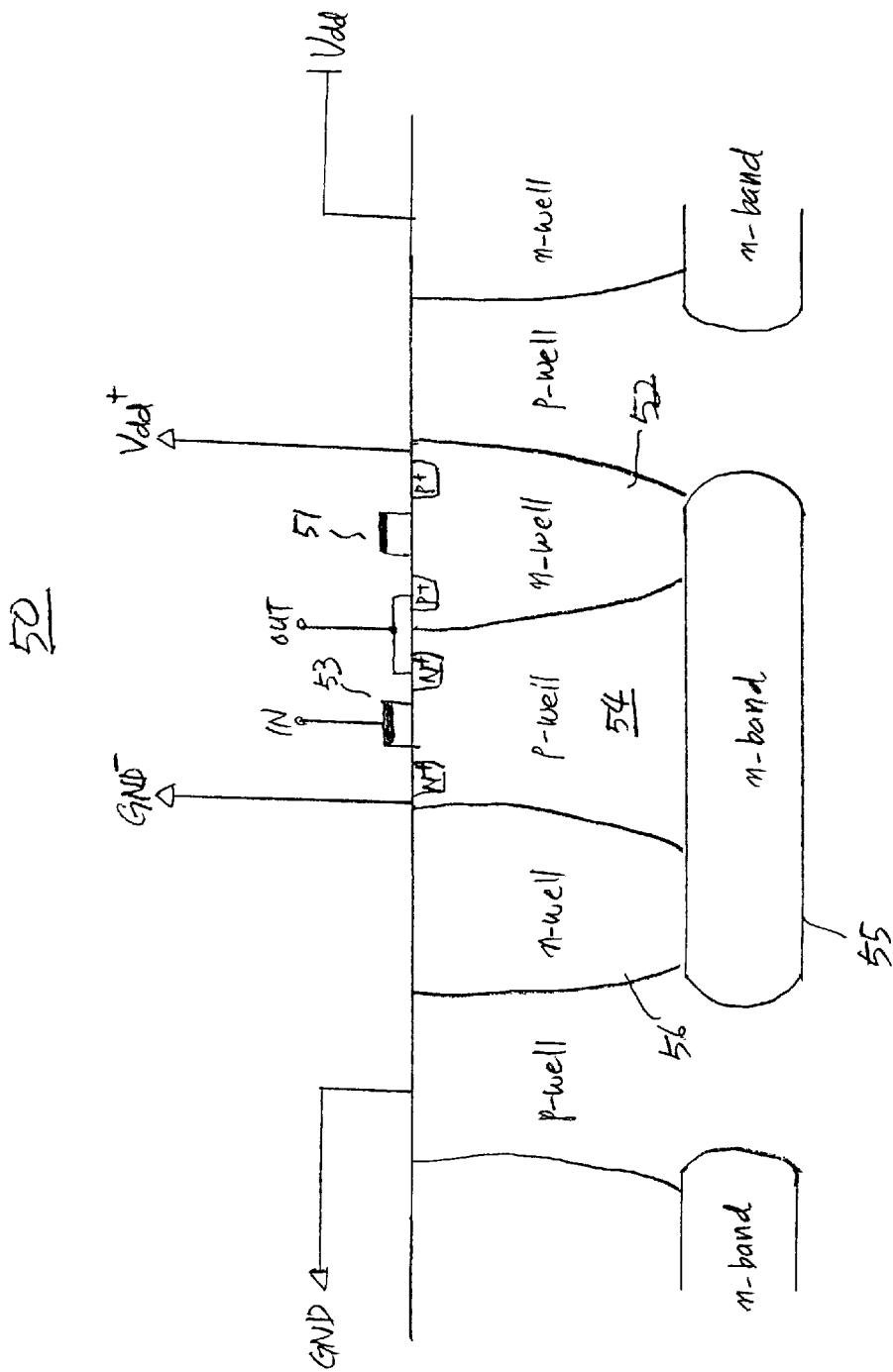
FIG. 5 is a cross-sectional view of an inverter used in the wordline driver in FIG. 4.

Referring to FIG. 5, there is provided a cross-sectional view of an inverter used in the wordline drivers in FIG. 4. The inverter 50 may be a wordline driver to be boosted in the positive or negative direction depending on the mode of the memory cells connected to a corresponding wordline.

Before describing the inverter 50 of the present invention, a typical inverter used in a conventional wordline driver has the CMOS device structure where a PMOS transistor is located in a n-well and an NMOS transistor is located in a p-substrate. In the inverter having such a structure, while the PMOS transistor located in the n-well can be biased because the n-well is isolated from other n-wells, the NMOS transistor located in the p-substrate cannot be biased because the p-substrate is connected together.

In the inverter 50 in FIG. 5, a PMOS transistor 51 is located in an n-well 52 and an NMOS transistor 53 is located in a p-well 54. The inverter 50 further includes an n-band 55 doped with negative ions. The p-well 54 is isolated from other p-wells by the n-band 55 as well as the n-wells 52, 56, so that the NMOS transistor 53 located in the p-well 54 can be biased. Thus, the PMOS transistor 51 and the NMOS transistor 53 can be boosted separately. In other words, the PMOS transistor 51 can be boosted in the positive direction, and the NMOS transistor 53 can be boosted in the negative direction.

To boost the PMOS transistor 51 located in the n-well 52, a high voltage ($V_{dd}^+$) is applied to the n-well 52. The high voltage ($V_{dd}^+$) has a value higher than a normal supply voltage ($V_{dd}$). By applying the high voltage ($V_{dd}^+$), the PMOS transistor 51 is boosted so that a wordline connected to the inverter 50 is boosted in the positive direction.

To boost the NMOS transistor 53 located in the p-well 54, a low voltage (GND$^-$) is applied to the p-well 54. The low voltage (GND$^-$) has a value lower than a normal ground (GND). By applying the low voltage (GND$^-$), the NMOS transistor 53 is negatively boosted so that a wordline connected to the inverter 50 is boosted in the negative direction. The negative-direction boosting of the wordline can be accomplished by isolating the p-well 54 from other p-wells with the n-band 55 and the n-wells 52, 56.

Here, the high voltage ($V_{dd}^+$) and the low voltage (GND$^-$) can be provided by an on-chip voltage generator. Such an on-chip voltage generator is well known in this art, thus a detailed description thereof is omitted.

Therefore, by separately biasing the n-well 52 in which the PMOS transistor 51 is located and the p-well 54 in which the NMOS transistor 53 is located, a wordline connected to the inverter is boosted in the positive direction or the negative direction. When the memory cell associated with the wordline is in the standby mode, the wordline is boosted in the negative direction and stays at a negative voltage, thereby substantially preventing the leakage current in the memory cell. On the other hand, when the memory cell is accessed, the wordline is boosted in the positive direction, thereby enhancing the performance of the memory cell.

Having described preferred embodiments of a CMOS memory cell and a wordline driver therefor according to the present invention, modifications and variations can be readily made by those skilled in the art in light of the above teachings. It is therefore to be understood that, within the scope of the appended claims, the present invention can be practiced in a manner other than as specifically described herein.

What is claimed is:

1. A semiconductor memory device accessed with wordlines and bitlines, comprising:

a plurality of memory cells of which a memory cell has pass transistors connected to a corresponding wordline and a corresponding pair of bitlines, the pass transistors being gated by a signal of the corresponding wordline; and a wordline drive unit for selectively driving the wordlines in response to a row address, wherein a wordline driver in the wordline drive unit boosts the corresponding wordline in a positive direction when the corresponding wordline is activated to access the memory cell and boosts the corresponding wordline in a negative direction when the corresponding wordline is inactive.

2. The semiconductor memory device of claim 1, further including:

a row decoder for decoding the row address to provide to the wordline drive unit a signal to select one of the wordlines;

a virtual power supply unit connected between the row decoder and a power supply, for providing a virtual supply voltage to the row decoder; and a virtual ground unit connected between the row decoder and a ground, for providing a virtual ground to the row decoder.

3. The semiconductor memory device of claim 2, wherein the virtual power supply unit has a PMOS transistor of which conduction path is connected between the power supply and the row decoder.

4. The semiconductor memory device of claim 2, wherein the virtual ground unit has an NMOS transistor of which conduction path is connected between the ground and the row decoder.

5. The semiconductor memory device of claim 1, wherein the pass transistors have a threshold voltage lower than a threshold voltage of transistors other than the pass transistors in the memory cell.

6. The semiconductor memory device of claim 5, wherein the threshold voltage of the pass transistors is about 0.3 volt and a supply voltage applied to the memory cell is about 1.8 volt.

7. The semiconductor memory device of claim 1, wherein the wordline driver boosts the corresponding wordline in the negative direction to the extent of substantially preventing a leakage current in the pass transistors.

8. The semiconductor memory device of claim 1, wherein the wordline driver includes:
 a PMOS transistor disposed in an n-well;
 an NMOS transistor disposed in a p-well; and
 an n-band doped with negative ions and disposed under the p-well to isolate the p-well from other p-wells in the wordline driver.

9. The semiconductor memory device of claim 8, wherein the n-well is biased with a voltage higher than a supply voltage when the wordline driver boost the corresponding wordline in the positive direction.

10. The semiconductor memory device of claim 8, wherein the p-well is biased with a voltage lower than a ground when the wordline driver boosts the corresponding wordline in the negative direction.

11. A method for controlling a leakage current in a memory cell having pass transistors with a low-threshold voltage, the method comprising the step of boosting a wordline connected to the memory cell in a negative direction when the wordline is inactive.

12. The method of claim 11, further including boosting the wordline in a positive direction when the wordline is activated to access the memory cell.

13. The method of claim 12, wherein the step of boosting the wordline in the positive direction includes applying a voltage higher than a supply voltage of the memory cell to an n-well in a wordline driver boosting the wordline, wherein the n-well is associated with a PMOS transistor connected to an output of the wordline driver.

14. The method of claim 11, wherein the step of boosting the wordline in the negative direction includes the steps of:
 forming an n-band doped with negative ions under a p-well in a wordline driver boosting the wordline, wherein an NMOS transistor is disposed in the p-well to connect to an input of the wordline driver;
 isolating the p-well from other p-wells with the n-band and n-wells in the wordline driver; and
 applying a voltage lower than a ground to the p-well.

15. The method of claim 14, wherein the memory cell is a CMOS memory cell in a static random access memory.

16. The method of claim 11, further including the step of providing a virtual supply voltage and a virtual ground for the step of boosting.

17. The method of claim 11, wherein the step of boosting the wordline includes boosting the wordline in the negative direction to the extent of substantially preventing a leakage current in the pass transistors.

* * * * *